(12) United States Patent
Qu et al.

(10) Patent No.: US 11,233,106 B2
(45) Date of Patent: Jan. 25, 2022

(54) ARRAY SUBSTRATE, DISPLAY APPARATUS, AND METHOD OF FABRICATING ARRAY SUBSTRATE

(71) Applicants: BOE Technology Group Co., Ltd., Beijing (CN); Beijing BOE Display Technology Co., Ltd., Beijing (CN)

(72) Inventors: Lianjie Qu, Beijing (CN); Xiaogai Chun, Beijing (CN); Xue Gao, Beijing (CN); Hebin Zhao, Beijing (CN); Guangdong Shi, Beijing (CN); Shuai Liu, Beijing (CN); Yonglian Qi, Beijing (CN); Bingqiang Gui, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 572 days.

(21) Appl. No.: 16/099,499

(22) PCT Filed: Sep. 29, 2017

(86) PCT No.: PCT/CN2017/104361
§ 371 (c)(1),
(2) Date: Nov. 7, 2018

(87) PCT Pub. No.: WO2019/061289
PCT Pub. Date: Apr. 4, 2019

(65) Prior Publication Data
US 2021/0225972 A1    Jul. 22, 2021

(51) Int. Cl.
*H01L 27/32*    (2006.01)

(52) U.S. Cl.
CPC ...... *H01L 27/3258* (2013.01); *H01L 27/3276* (2013.01); *H01L 2227/323* (2013.01)

(58) Field of Classification Search
None
See application file for complete search history.

(56) References Cited

U.S. PATENT DOCUMENTS 8,164,099 B2 * 4/2012 Yamazaki ........... H01L 27/1214
257/72
9,129,927 B2    9/2015 Gupta et al.
(Continued)

FOREIGN PATENT DOCUMENTS

CN    104867921 A    8/2015
CN    105408813 A    3/2016
(Continued)

OTHER PUBLICATIONS

Partial supplementary European Search Report in the European Patent Application No. 17910498.9, dated Feb. 14, 2020.
(Continued)

*Primary Examiner* — Dung A. Le
(74) *Attorney, Agent, or Firm* — Intellectual Valley Law, P.C.

(57) ABSTRACT

The present application discloses an array substrate, a display apparatus and a method of fabricating an array substrate. The array substrate has a plurality of first bottom-gate type thin film transistors each of which including a metal oxide active layer and a plurality of second bottom-gate type thin film transistors each of which including a silicon active layer.

16 Claims, 9 Drawing Sheets

(56) References Cited

U.S. PATENT DOCUMENTS

| | | | |
|---|---|---|---|
| 2010/0176383 A1 | 7/2010 | Park et al. | |
| 2012/0305910 A1 | 12/2012 | Hsieh et al. | |
| 2013/0092927 A1 | 4/2013 | Imade et al. | |
| 2014/0014962 A1 | 1/2014 | Arai et al. | |
| 2015/0055051 A1 | 2/2015 | Osawa et al. | |
| 2015/0243685 A1 | 8/2015 | Lee et al. | |
| 2016/0291714 A1 | 10/2016 | Wu et al. | |
| 2017/0294456 A1* | 10/2017 | Lee | H01L 27/1225 |
| 2018/0151595 A1* | 5/2018 | Saitoh | H01L 27/124 |
| 2018/0175073 A1 | 6/2018 | Wang | |
| 2019/0013339 A1* | 1/2019 | Li | H01L 27/3213 |
| 2021/0028377 A1* | 1/2021 | Maruyama | H01L 27/1255 |

FOREIGN PATENT DOCUMENTS

| | | |
|---|---|---|
| CN | 106057735 A | 10/2016 |
| CN | 106449521 A | 2/2017 |
| CN | 106449667 A | 2/2017 |
| CN | 106876412 A | 6/2017 |
| CN | 107026178 A | 8/2017 |
| JP | 2010161327 A | 7/2010 |
| JP | 2014017456 A | 1/2014 |
| WO | 2019006988 A1 | 1/2019 |

OTHER PUBLICATIONS

International Search Report & Written Opinion dated Jul. 13, 2018, regarding PCT/CN2017/104361.

Bottom-Gate ELA Poly-Si TFT for High-Resolution AMOLED Mobile Displays, Kummi Oh et. al., SID 2016 Digest, p. 923-926 (2016).

Office Action in the Japanese Patent Application No. 2018565011, dated Sep. 14, 2021; English translation attached.

\* cited by examiner

ARRAY SUBSTRATE, DISPLAY APPARATUS, AND METHOD OF FABRICATING ARRAY SUBSTRATE

CROSS-REFERENCE TO RELATED APPLICATION

This application is a national stage application under 35 U.S.C. § 371 of International Application No. PCT/CN2017/104361, filed Sep. 29, 2017, the contents of which are incorporated by reference in the entirety.

TECHNICAL FIELD

The present invention relates to display technology, more particularly, to an array substrate, a display apparatus, and a method of fabricating an array substrate.

BACKGROUND

An array substrate typically includes a plurality of subpixels in its display area, each of the plurality of subpixels is controlled by a thin film transistor for image display. Various driving circuits of the array substrate are typically disposed in a peripheral area of the array substrate. These driving circuits also include thin film transistors necessary for their operation.

SUMMARY

In one aspect, the present invention provides an array substrate, having a plurality of first bottom-gate type thin film transistors each of which comprising a metal oxide active layer and a plurality of second bottom-gate type thin film transistors each of which comprising a silicon active layer.

Optionally, the array substrate comprises a base substrate; a gate electrode layer on the base substrate and comprising a plurality of first gate electrodes respectively for the plurality of first bottom-gate type thin, film transistors and a plurality of second gate electrodes respectively for the plurality of second bottom-gate type thin film transistors; a gate insulating layer on a side of the gate electrode layer distal to the base substrate; a metal oxide layer comprising a plurality of metal oxide active layers respectively for the plurality of first bottom-gate type thin film transistors, each of the plurality of metal oxide active layers on a side of the gate insulating layer distal to one of the plurality of first gate electrodes; and a polysilicon layer comprising a plurality of polycrystalline silicon active layers respectively for the plurality of second bottom-gate type thin film transistors, each of the plurality of polycrystalline silicon active layers on a side of the gate insulating layer distal to one of the plurality of second gate electrodes.

Optionally, the array substrate further comprises a first insulating layer on a side of the polysilicon layer distal to the gate insulating layer; and a second insulating layer on a side of the metal oxide layer distal to the first insulating layer; wherein the first insulating layer is between the polysilicon layer and the metal oxide layer.

Optionally, the array substrate further comprises a source-drain electrode layer comprising a plurality of first source electrodes, a plurality of first drain electrodes, a plurality of second source electrodes, and a plurality of second drain electrodes; each of the plurality of metal oxide active layers is electrically connected to one of the plurality of first source electrodes and one of the plurality of first drain electrodes through vias extending through the second insulating layer; and each of the plurality of polycrystalline silicon active layers is electrically connected to one of the plurality of second source electrodes and one of the plurality of second drain electrodes through vias extending through the first insulating layer and the second insulating layer.

Optionally, the array substrate further comprises a passivation layer on a side of the source-drain electrode layer distal to the second insulating layer; a first electrode layer on a side of the passivation layer distal to the source-drain electrode layer; and a second electrode layer on a side of the first electrode layer distal to the base substrate; wherein the first electrode layer and the second electrode layer are two different layers selected from a pixel electrode layer and a common electrode layer.

Optionally, the array substrate further comprises a first electrode layer and a second electrode layer, the first electrode layer and the second electrode layer are two different layers selected from a pixel electrode layer and a common electrode layer; wherein the first electrode layer is in a same layer as the gate electrode layer; and the gate insulating layer is on a side of the gate electrode layer and the first electrode layer distal to the base substrate.

Optionally, the array substrate further comprises a source-drain electrode layer on a side of the metal oxide layer and the polysilicon layer distal to the gate insulating layer; the source-drain electrode layer comprising a plurality of first source electrodes, a plurality of first drain electrodes, a plurality of second source electrodes, and a plurality of second drain electrodes; each of the plurality of metal oxide active layers is electrically connected to one of the plurality of first source electrodes and one of the plurality of first drain electrodes; and each of the plurality of polycrystalline silicon active layers is electrically connected to one of the plurality of second source electrodes and one of the plurality of second drain electrodes.

Optionally, the plurality of first bottom-gate type thin film transistors are back channel etching type thin film transistors.

Optionally, the array substrate further comprises a first insulating layer on a side of the polysilicon layer distal to the gate insulating layer; wherein the first insulating layer is between the polysilicon layer and the metal oxide layer; and each of the plurality of polycrystalline silicon active layers is electrically connected to one of the plurality of second source electrodes and one of the plurality of second drain electrodes through vias extending through the first insulating layer.

Optionally, the array substrate further comprises a passivation layer on a side of the source-drain electrode layer distal to the gate insulating layer; wherein the second electrode layer is on a side of the passivation layer distal to the source-drain electrode layer.

Optionally, the plurality of first bottom-gate type thin film transistors are in a display area, and the plurality of second bottom-gate type thin film transistors are in a peripheral area.

Optionally, the plurality of first bottom-gate type thin film transistors are a plurality of drive thin film transistors each of which connected to a power supply line and an organic light emitting diode; and the plurality of second bottom-gate type thin film transistors are a plurality of switch thin film transistors each of which connected to a data line and a gate electrode of one of the plurality of drive thin film transistors.

Optionally, the array substrate further comprises a display driver circuitry; wherein the display driver circuity comprises the plurality of second bottom-gate type thin film transistors.

In another aspect, the present invention provides a display apparatus comprising the array substrate described herein or fabricated by a method described herein.

In another aspect, the present invention provides a method of fabricating an array substrate, comprising forming a plurality of first bottom-gate type thin film transistors each of which comprising a metal oxide active layer and a plurality of second bottom-gate type thin film transistors each of which comprising a silicon active layer.

Optionally, the method comprises forming a gate electrode layer on a base substrate, the gate electrode layer formed to comprise a plurality of first gate electrodes respectively for the plurality of first bottom-gate type thin film transistors and a plurality of second gate electrodes respectively for the plurality of second bottom-gate type thin film transistors; forming a gate insulating layer on a side of the gate electrode layer distal to the base substrate; forming a metal oxide layer comprising a plurality of metal oxide active layers respectively for the plurality of first bottom-gate type thin film transistors, each of the plurality of metal oxide active layers on a side of the gate insulating layer distal to one of the plurality of first gate electrodes; and forming a polysilicon layer comprising a plurality of polycrystalline silicon active layers respectively for the plurality of second bottom-gate type thin film transistors, each of the plurality of polycrystalline silicon active layers on a side of the gate insulating layer distal to one of the plurality of second gate electrodes.

Optionally, the method further comprises forming a first insulating layer on a side of the polysilicon layer distal to the gate insulating layer; and forming a second insulating layer on a side of the metal oxide layer distal to the first insulating layer; wherein the first insulating layer is formed between the polysilicon layer and the metal oxide layer.

Optionally, the method further comprises forming a source-drain electrode layer, the source-drain electrode layer is formed to comprise a plurality of first source electrodes, a plurality of first drain electrodes, a plurality of second source electrodes, and a plurality of second drain electrodes; forming vias extending through the second insulating layer for electrically connecting each of the plurality of metal oxide active layers to one of the plurality of first source electrodes and one of the plurality of first drain electrodes; and forming vias extending through the first insulating layer and the second insulating layer for electrically connecting each of the plurality of polycrystalline silicon active layers to one of the plurality of second source electrodes and one of the plurality of second drain electrodes.

Optionally, the method further comprises forming a passivation layer on a side of the source-drain electrode layer distal to the second insulating layer; forming a first electrode layer on a side of the passivation layer distal to the source-drain electrode layer; and forming a second electrode layer on a side of the first electrode layer distal to the base substrate; wherein the first electrode layer and the second electrode layer are two different layers selected from a pixel electrode layer and a common electrode layer.

Optionally, the method further comprises forming a first electrode layer and forming a second electrode layer, the first electrode layer and the second electrode layer are two different layers selected from a pixel electrode layer and a common electrode layer; wherein the first electrode layer and the gate electrode layer are formed in a same layer in a single process using a same mask plate; and the gate insulating layer is formed on a side of the gate electrode layer and the first electrode layer distal to the base substrate.

Optionally, the method further comprises forming a source-drain electrode layer on a side of the metal oxide layer and the polysilicon layer distal to the gate insulating layer; wherein the source-drain electrode layer is formed to comprise a plurality of first source electrodes, a plurality of first drain electrodes, a plurality of second source electrodes, and a plurality of second drain electrodes; each of the plurality of metal oxide active layers is formed to be electrically connected to one of the plurality of first source electrodes and one of the plurality of first: drain electrodes; each of the plurality of polycrystalline silicon active layers is formed to be electrically connected to one of the plurality of second source electrodes and one of the plurality of second drain electrodes; and channel regions of the plurality of metal oxide active layers are formed in a back channel etching process.

Optionally, the method further comprises forming a first insulating layer on a side of the polysilicon layer distal to the gate insulating layer, the first insulating layer formed between the polysilicon layer and the metal oxide layer; and forming vias extending through the first insulating layer for electrically connecting each of the plurality of polycrystalline silicon active layers to one of the plurality of second source electrodes and one of the plurality of second drain electrodes.

Optionally, the method further comprises forming a passivation layer on a side of the source-drain electrode layer distal to the gate insulating layer; wherein the second electrode layer is on a side of the passivation layer distal to the source-drain electrode layer.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

It was discovered in the present disclosure that an enhanced display quality can be achieved by having the thin film transistors in the driving circuits to have a high switching speed and a high driving current, and having the thin film transistors in the plurality of subpixels to have a low leakage current and a high uniformity. For example, it was discovered in the present disclosure that an enhanced display quality in a liquid crystal display panel can be achieved by having different types of thin film transistors respectively for the plurality of subpixels and for the gate-on-array circuit.

In some embodiments, the thin film transistors in the plurality of subpixels may be metal oxide transistors and the thin film transistors in the gate-on-array circuit may be polysilicon transistors. For example, the metal oxide transistors may be bottom-gate type transistors and the polysilicon transistors may be top-gate type transistors. However, it was discovered in the present disclosure that the process for fabricating such an array substrate is extremely cumbersome as it demands as marry as 11 mask plates for making the array substrate.

Accordingly, the present disclosure, provides, inter alia, an array substrate, a display apparatus, and a method of fabricating an array substrate that substantially obviate one or more of the problems due to limitations and disadvantages of the related art. In one aspect, the present disclosure provides an array substrate. In some embodiments, the array substrate includes a plurality of first bottom-gate type thin film transistors each of which having a metal oxide active layer and a plurality of second bottom-gate type thin film transistors each of which having a silicon active layer. Optionally, the silicon active layer is a polycrystalline silicon active layer. Optionally, the silicon active layer is an amorphous silicon active layer.

Figure 1A:
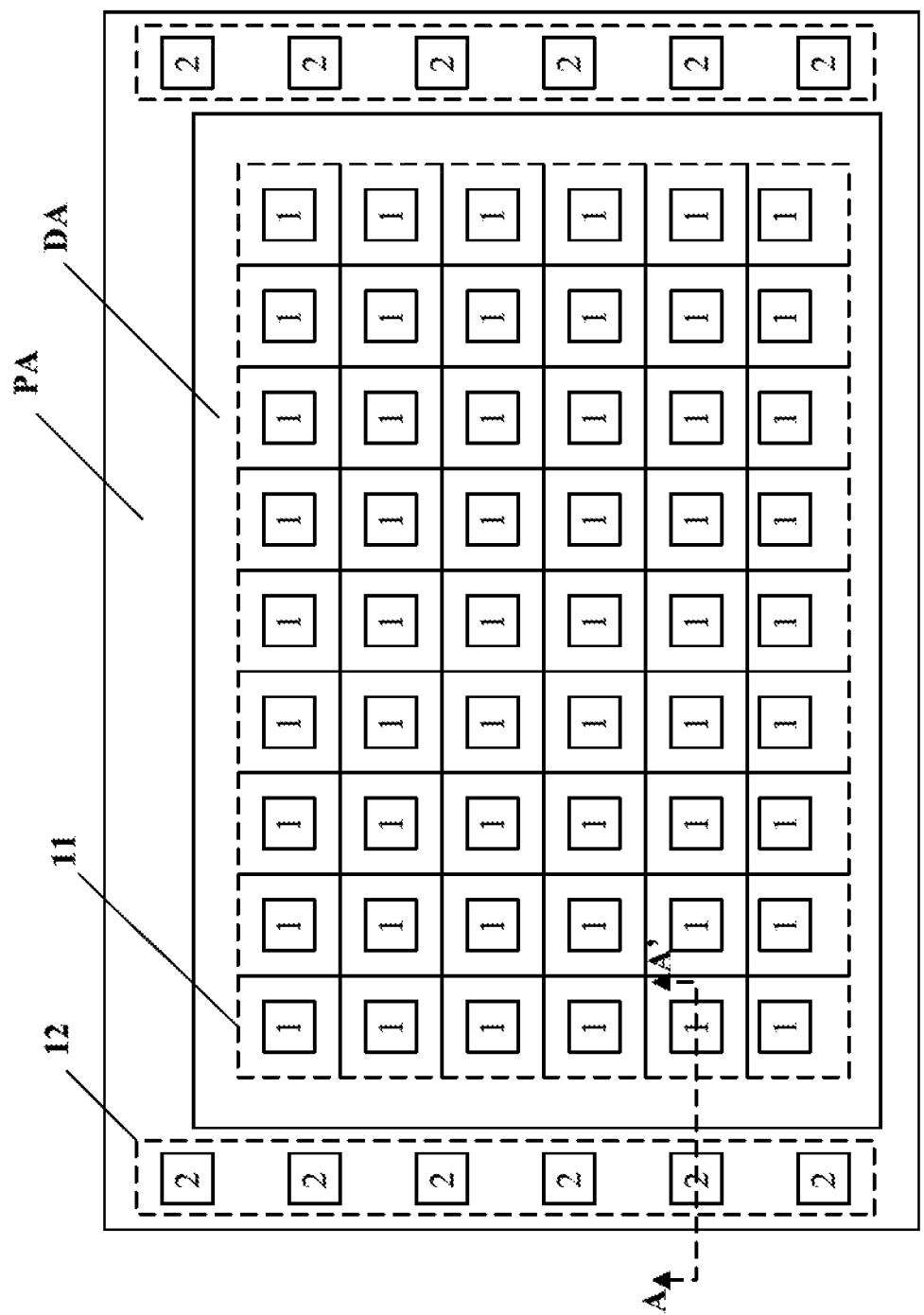
FIG. 1A is a schematic diagram illustrating the structure of an array substrate in some embodiments according to the present disclosure.

FIG. 1A is a schematic diagram illustrating the structure of an array substrate in some embodiments according to the present disclosure. Referring to FIG. 1A, the array substrate in some embodiments includes a plurality of first bottom-gate type thin film transistors 1 and a plurality of second bottom-gate type thin film transistors 2. Each of the plurality of first bottom-gate type thin film transistors 1 is a thin film transistor having a metal oxide active layer. Each of the plurality of second bottom-gate type thin film transistors 2 is a thin film transistor having a polycrystalline silicon active layer. Optionally, the array substrate is formed to have a display area DA and a peripheral area PA. Optionally, the plurality of first bottom-gate type thin film transistors 1 are in the display area DA, and the plurality of second bottom-gate type thin film transistors 2 are in the peripheral area PA. Optionally, the array substrate includes an array of a matrix of a plurality of subpixels 11, and each of the plurality of first bottom-gate type thin film transistors 1 is in one of the plurality of subpixels 11, as shown in FIG. 1A. Optionally, the array substrate includes a display driver circuitry 12, and the display driver circuitry 12 includes the plurality of second bottom-gate type thin film transistors 2. Optionally, the display driver circuitry 12 is a gate-on-array circuit for driving a plurality of gate lines in the array substrate. Optionally, the display driver circuitry 12 is a demultiplexer circuit. Optionally, the array substrate is a liquid crystal array substrate.

As used herein the term "peripheral area" refers to an area where various circuits and wires are provided to transmit signals to the array substrate. To increase the transparency of the display apparatus, non-transparent or opaque components of the display apparatus (e.g., battery, printed circuit board, metal frame), can be disposed in the peripheral area rather than in the display areas. As used herein, the term "display area" refers to an area of the array substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display. An inter-subpixel region refers to a region between adjacent subpixel regions, such as a region corresponding to a black matrix in a liquid crystal display or a region corresponding a pixel definition layer in an organic light emitting diode display. Optionally, the inter-subpixel region is a region between adjacent subpixel regions in a same pixel. Optionally, the inter-subpixel region is a region between two adjacent subpixel regions from two adjacent pixels.

Figure 1B:
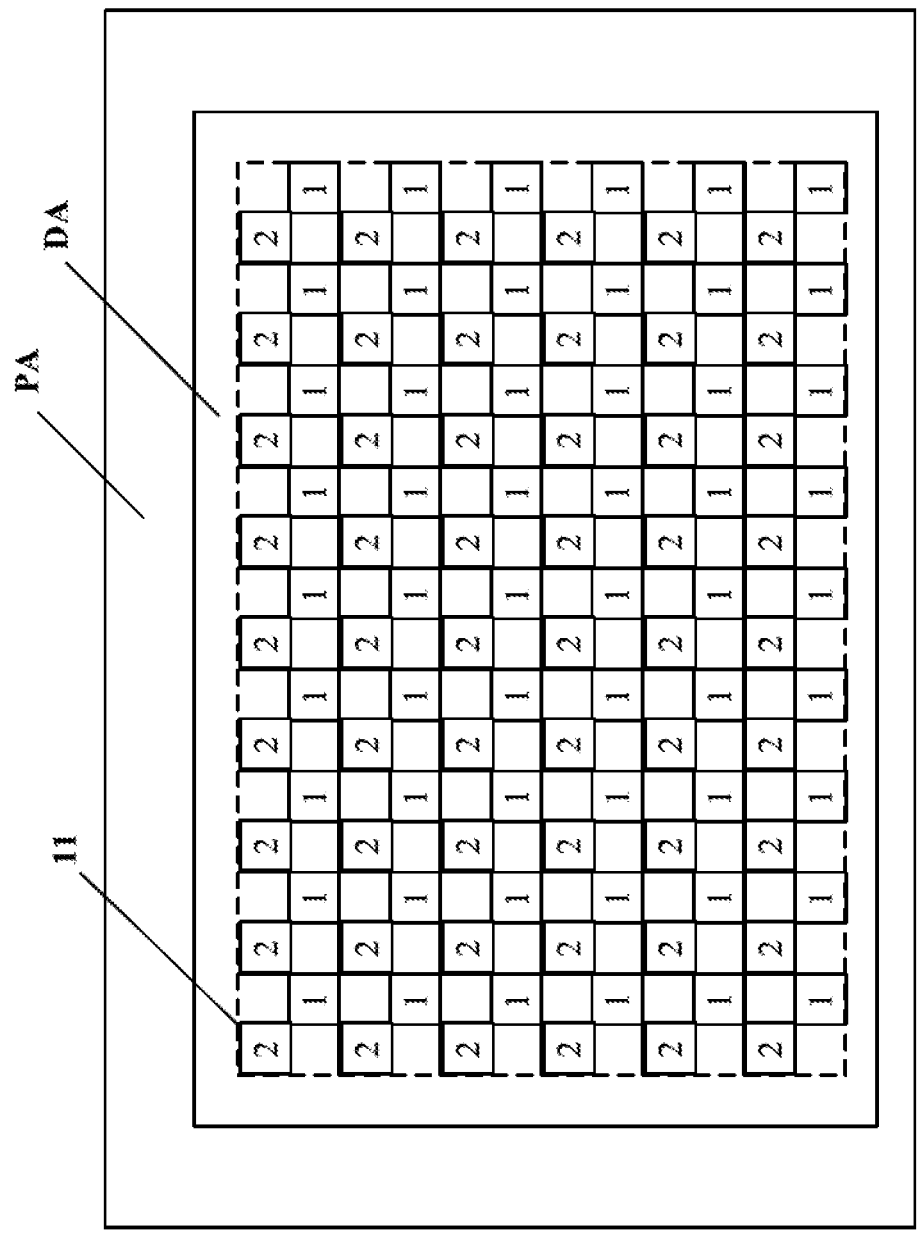
FIG. 1B is a schematic diagram illustrating the structure of an array substrate in some embodiments according to the present disclosure.

In some embodiments, the display area of the array substrate includes both a plurality of first bottom-gate type thin film transistors and a plurality of second bottom-gate type thin film transistors. FIG. 1B is a schematic diagram illustrating the structure of an array substrate in some embodiments according to the present disclosure. Referring to FIG. 1B, the array substrate in some embodiments includes a plurality of first bottom-gate type thin film transistors 1 and a plurality of second bottom-gate type thin film transistors 2, both of which in the display area DA. Each of the plurality of first bottom-gate type thin film transistors 1 is a thin film transistor having a metal oxide active layer. Each of the plurality of second bottom-gate type thin film transistors 2 is a thin film transistor having a polycrystalline silicon active layer. In one example, the array substrate includes an array of a matrix of a plurality of subpixels 11, each of which includes at least one of the plurality of first bottom-gate type thin film transistors 1 and at least one of the plurality of second bottom-gate type thin film transistors 2. Optionally, the array substrate is an organic light emitting diode array substrate. Optionally, the plurality of first bottom-gate type thin film transistors 1 are drive thin film transistors (e.g., transistors connected to the power supply line and to the light emitting diode) in an organic light emitting diode array substrate. Optionally, the plurality of second bottom-gate type thin film transistors 2 are switch thin film transistors (e.g., transistors connected to data lines and the gate electrode of the drive transistors, i.e., address selection thin film transistors) in an organic light emitting diode array substrate.

Figure 1C:
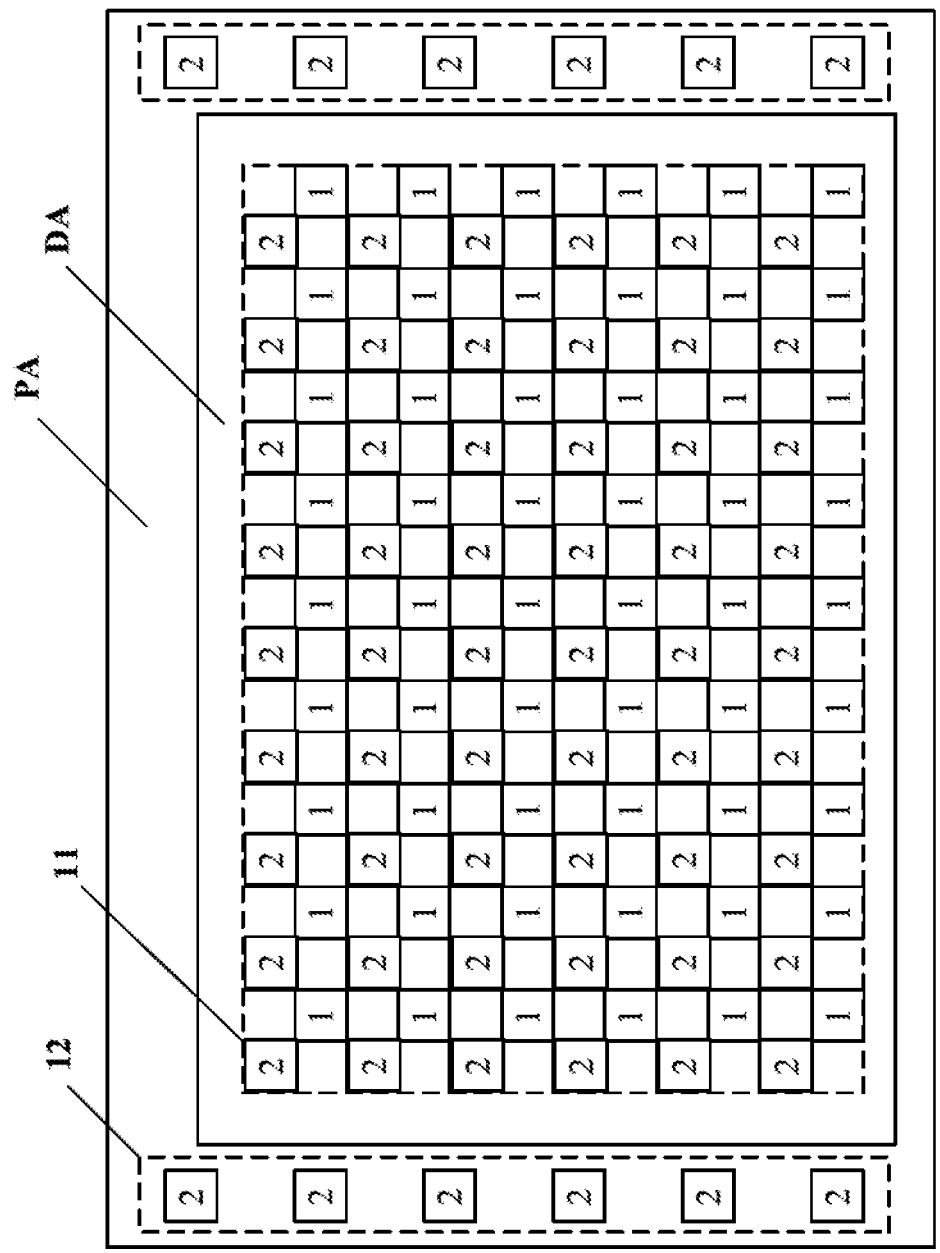
FIG. 1C is a schematic diagram illustrating the structure of an array substrate in some embodiments according to the present disclosure.

In some embodiments, the plurality of first bottom-gate type thin film transistors are in the display area, and the plurality of second bottom-gate type thin film transistors are in the display area and the peripheral area. FIG. 1C is a schematic diagram illustrating the structure of an array substrate in some embodiments according to the present disclosure. Referring FIG. 1C, the array substrate in some embodiments includes a plurality of first bottom-gate type thin film transistors 1 and a plurality of second bottom-gate type thin film transistors 2. The peripheral area PA includes multiple second bottom-gate type thin film transistors of the plurality of second bottom-gate type thin film transistors 2. The display area DA includes the plurality of first bottom-gate type thin film transistors 1 and multiple second bottom-gate type thin film transistors of the plurality of second bottom-gate type thin film transistors 2. In one example, array substrate is an organic light emitting diode array substrate. Optionally, the plurality of first bottom-gate type thin film transistors 1 are drive thin film transistors (e.g., transistors connected to the power supply line and to the light emitting diode) in an organic light emitting diode array substrate. Optionally, the plurality of second bottom-gate type thin film transistors 2 in the display area DA are switch thin film transistors (e.g., transistors connected to data lines and the gate electrode of the drive transistors, i.e., address selection thin film transistors) in an organic light emitting diode array substrate. Optionally, the plurality of second bottom-gate type thin film transistors 2 in the peripheral area PA are thin film transistors in the display driver circuitry 12, which is disposed in the peripheral area PA.

Figure 2:
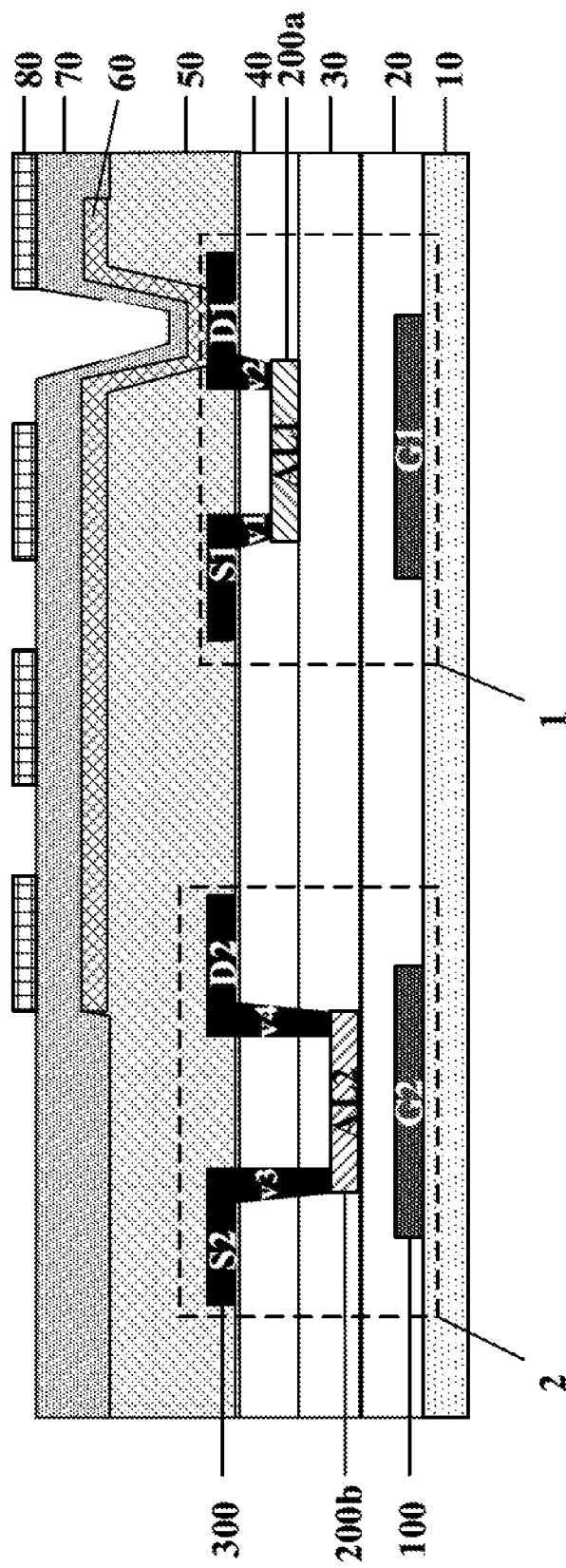
FIG. 2 is a cross-sectional view along line A-A' in the array substrate of FIG. 1A in some embodiments according to the present disclosure.
Figure 3:
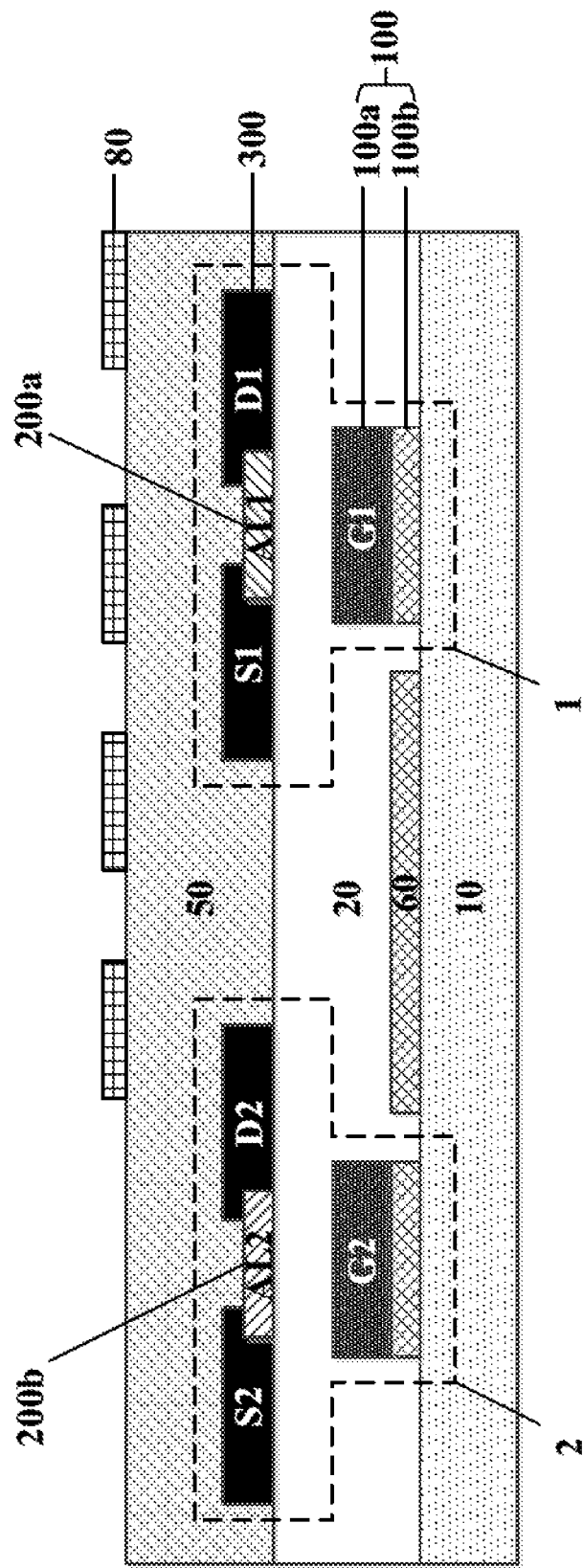
FIG. 3 is a cross-sectional view along line A-A' in the array substrate of FIG. 1A in some embodiments according to the present disclosure.
Figure 4:
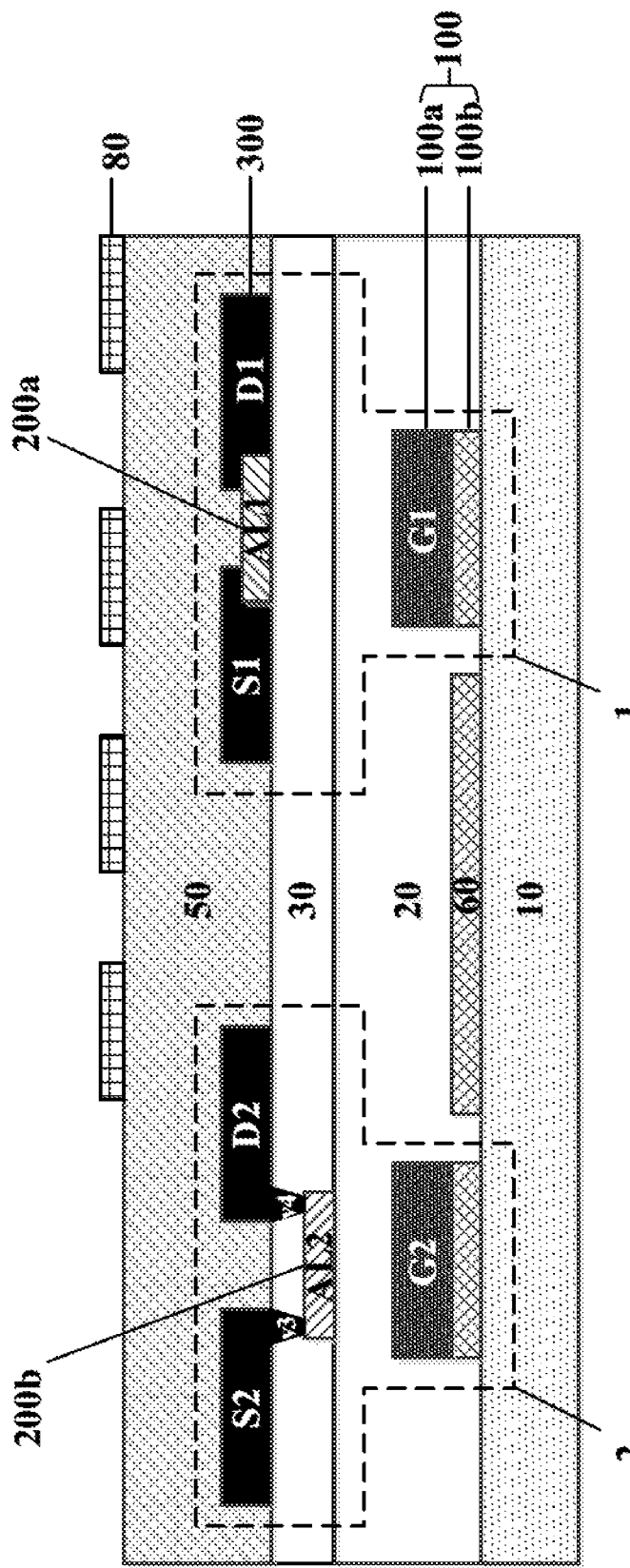
FIG. 4 is a cross-sectional view along line A-A' in the array substrate of FIG. 1A in some embodiments according to the present disclosure.

FIG. 2 is a cross-sectional view along line A-A' in the array substrate of FIG. 1A in some embodiments according to the present disclosure. FIG. 3 is a cross-sectional view along line A-A' in the array substrate of FIG. 1A in some embodiments according to the present disclosure. FIG. 4 is a cross-sectional view along line A-A' in the array substrate of FIG. 1A in some embodiments according to the present disclosure. Referring to FIGS. 2 to 4, one of the plurality of first bottom-gate type thin film transistors 1 and one of the plurality of second bottom-gate type thin film transistors 2 are shown in an array substrate. The array substrate includes a base substrate 10, a gate electrode layer 100 on the base substrate 10; a gate insulating layer 20 on a side of the gate electrode layer 100 distal to the base substrate 10; a metal oxide layer 200a; and a polysilicon layer 200b. The gate electrode layer 100 includes a plurality of first gate electrodes G1 respectively for the plurality of first bottom-gate type thin film transistors 1 and a plurality of second gate electrodes G2 respectively for the plurality of second bottom-gate type thin film transistors 2. The metal oxide layer 200a includes a plurality of metal oxide active layers AL1 respectively for the plurality of first bottom-gate type thin film transistors 1. The polysilicon layer 200b includes a plurality of polycrystalline silicon active layers AL2 respectively for the plurality of second bottom-gate type thin film transistors 2. Each of the plurality of metal oxide active layers AL1 is on a side of the gate insulating layer 20 distal to one of the plurality of first gate electrodes G1. Each of the plurality of polycrystalline silicon active layers AL2 is on a side of the gate insulating layer 20 distal to one of the plurality of second gate electrodes G2.

Optionally, the plurality of first gate electrodes G1 and the plurality of second gate electrodes G2 are in a same layer and patterned in a single process using a same mask plate and a same conductive material. Optionally, the plurality of first gate electrodes G1 and the plurality of second gate electrodes G2 are in different layers, e.g., formed in two patterning processes or using two mask plates. As used herein, the term "same layer" refers to the relationship between the layers simultaneously formed in the same step. In one example, the plurality of first gate electrodes G1 and the plurality of second gate electrodes G2 are in a same layer when they are formed as a result of one or more steps of a same patterning process performed in a same layer of material. In another example, the plurality of first gate electrodes G1 and the plurality of second gate electrodes G2 can be formed in a same layer by simultaneously performing the step of forming the plurality of first gate electrodes G1 and the step of forming the plurality of second gate electrodes G2. The term "same layer" does not always mean that the thickness of the layer or the height of the layer in a cross-sectional view is the same.

The metal oxide layer 200a and the polysilicon layer 200b are in different layers as they are formed in two separate patterning processes. Optionally, the metal oxide layer 200a and the polysilicon layer 200b may be formed on a substantially the same horizontal plane as shown in FIG. 3. In one example, both the metal oxide layer 200a and the polysilicon layer 200b are formed on the surface of the gate insulating layer 20. Optionally, the metal oxide layer 200a and the polysilicon layer 200b may be formed on two different horizontal planes as shown in FIG. 2 and FIG. 4. In one example, the metal oxide layer 200a is formed on the surface of a first insulating layer 30 whereas the polysilicon layer 200b is formed on the surface of the gate insulating layer 20.

Referring to FIG. 2, the array substrate in some embodiments further includes a first insulating layer 30 on a side of the polysilicon layer 200b distal to the gate insulating layer 20; and a second insulating layer 40 on a side of the metal oxide layer 200a distal to the first insulating layer 30, so that the first insulating layer 30 is between the polysilicon layer 200b and the metal oxide layer 200a, the polysilicon layer 200b is between the gate insulating layer 20 and the first insulating layer 30, and the metal oxide layer 200a is between the first insulating layer 30 and the second insulating layer 40. The array substrate in some embodiments further includes a source-drain electrode layer 300 having a plurality of first source electrodes S1, a plurality of first drain electrodes D1, a plurality of second source electrodes S2, and a plurality of second drain electrodes D2. Each of the plurality of metal oxide active layers AL1 is electrically connected to one of the plurality of first source electrodes S1 and one of the plurality of first drain electrodes D1 through vias extending through the second insulating layer 40. As shown in FIG. 2, each of the plurality of first source electrodes S1 is electrically connected to one of the plurality of metal oxide active layers AL1 through a via v1 extending through the second insulating layer 40, and each of the plurality of first drain electrodes D1 is electrically connected to one of the plurality of metal oxide active layers AL1 through a via v2 extending through the second insulating layer 40. Optionally, each of the plurality of polycrystalline silicon active layers AL2 is electrically connected to one of the plurality of second source electrodes S2 and one of the plurality of second drain electrodes D2 through vias extending through the first insulating layer 30 and the second insulating layer 40. For example, each of the plurality of second source electrodes S2 is electrically connected to one of the plurality of polycrystalline silicon active layers AL2 through a via v3 extending through the first insulating layer 30 and the second insulating layer 40, and each of the plurality of second drain electrodes D2 is electrically connected to one of the plurality of polycrystalline silicon active layers AL2 through a via v4 extending through the first insulating layer 30 and the second insulating layer 40.

Optionally, the plurality of first source electrodes S1, the plurality of first drain electrodes D1, the plurality of second source electrodes S2, and the plurality of second drain electrodes D2 are in a same layer and patterned in a single process using a same mask plate and a same conductive material. Optionally, the plurality of first source electrodes S1, the plurality of first drain electrodes D1, the plurality of second source electrodes S2, and the plurality of second drain electrodes D2 are in different layers, e.g., formed in two patterning processes or using two mask plates. For example, the plurality of first source electrodes S1 and the plurality of first drain electrodes D1 are in a first layer, and the plurality of second source electrodes S2 and the plurality of second drain electrodes D2 are in a second layer.

In some embodiments, the array substrate further includes a passivation layer. Referring to FIGS. 2 to 4, the array substrate further includes a passivation layer 50 on a side of the source-drain electrode layer 300 distal to the second insulating layer 40. In some embodiments, the array substrate is an organic light emitting diode array substrate. In some embodiments, the array substrate is a liquid crystal array substrate.

Referring to FIG. 2, the array substrate further includes a first electrode layer 60 on a side of the passivation layer 50 distal to the source-drain electrode layer 300. The first electrode layer 60 may be a pixel electrode layer. Optionally, the first electrode layer 60 is a common electrode layer. In some embodiments, a display apparatus having the array substrate further includes a second electrode layer, the first electrode layer and the second electrode layer are two different layers selected from a pixel electrode layer and a common electrode layer. Optionally, the second electrode layer is disposed in a counter substrate (e.g., a color filter substrate) facing the array substrate. Optionally, and as shown in FIG. 2, the array substrate further includes the second electrode layer 80 on a side of the first electrode layer 60 distal to the base substrate 10. Optionally, the array substrate further includes a third insulating layer 70 between the first electrode layer 60 and the second electrode layer 80.

In some embodiments, the first electrode layer 60 is disposed on a side of the metal oxide layer 200a and the polysilicon layer 200b proximal to the base substrate 10. Referring to FIG. 3 and FIG. 4, the array substrate in some embodiments includes a first electrode layer 60 in a same layer as the gate electrode layer 100. The gate insulating layer 20 is on a side of the gate electrode layer 100 and the first electrode layer 60 distal to the base substrate 10. Optionally, the gate electrode layer 100 includes two sublayers, the first sublayer 100a is on a side of a second sublayer 100b distal to the base substrate 10. The second sublayer 100b is made of a same material as the first electrode layer 60. Optionally, the first electrode layer 60 and the second sublayer 100b of the gate electrode layer 100 are made of a transparent conductive material such as a transparent metal oxide material (e.g., indium tin oxide), and the first sublayer 100a is made of a metal conductive material. Optionally, the first electrode layer 60, the first sublayer 100a of the gate electrode layer 100, and the second sublayer 100b of the gate electrode layer 100 are in a same layer, e.g., formed in a same patterning process and using a same mask plate. Optionally, the array substrate further includes a second electrode layer 80 on a side of the passivation layer 50 distal to the base substrate 10. The first electrode layer and the second electrode layer are two different layers selected from a pixel electrode layer and a common electrode layer. Optionally, the second electrode layer 80 is disposed in a counter substrate facing the array substrate in a display apparatus having the present array substrate.

Referring to FIG. 3 and FIG. 4, the array substrate in some embodiments further includes a source-drain electrode layer 300 on a side of the metal oxide layer 200a and the polysilicon layer 200b distal to the gate insulating layer 20. The source-drain electrode layer 300 includes a plurality of first source electrodes S1, a plurality of first drain electrodes D1, a plurality of second source electrodes S2, and a plurality of second drain electrodes D2. Each of the plurality of metal oxide active layers AL1 is electrically connected to one of the plurality of first source electrodes S1 and one of the plurality of first drain electrodes D1. Each of the plurality of polycrystalline silicon active layers AL2 is electrically connected to one of the plurality of second source electrodes S2 and one of the plurality of second drain electrodes D2.

In some embodiments, and as shown in FIG. 3, the source-drain electrode layer 300 is directly formed on a side of the metal oxide layer 200a and the polysilicon layer 200b distal to the gate insulating layer 20. The array substrate does not include any insulating layer between the source-drain electrode layer 300 and the metal oxide layer 200a or between the source-drain electrode layer 300 and the polysilicon layer 200b. Optionally, the plurality of first bottom-gate type thin film transistors 1 are back channel etching type thin film transistors. In FIG. 2, the metal oxide layer 200a and the polysilicon layer 200b are substantially co-planar, e.g., substantially on a same horizontal plane.

In some embodiments, and as shown in FIG. 4, the array substrate further includes a first insulating layer 30 on a side of the polysilicon layer 200b distal to the gate insulating layer 20, so that the first insulating layer 30 is between the source-drain electrode layer 300 and the polysilicon layer 200b. However, the source-drain electrode layer 300 is directly funned on a side of the metal oxide layer 200a distal to the gate insulating layer 20, e.g., the first insulating layer 30 is not between the source-drain electrode layer 300 and the metal oxide layer 200a. Optionally, the plurality of first bottom-gate type thin film transistors 1 are back channel etching type thin film transistors. In FIG. 4, the metal oxide layer 200a and the polysilicon layer 200b are on two different horizontal planes. Each of the plurality of polycrystalline silicon active layers AL2 is electrically connected to one of the plurality of second source electrodes S2 and one of the plurality of second drain electrodes D2 through vias extending through the first insulating layer 30. For example, each of the plurality of second source electrodes S2 is electrically connected to one of the plurality of polycrystalline silicon active layers AL2 through a via v3 extending through the first insulating layer 30, and each of the plurality of second drain electrodes D2 is electrically connected to one of the plurality of polycrystalline silicon active layers AL2 through a via v4 extending through the first insulating layer 30.

Referring to FIG. 3 and FIG. 4, the plurality of first source electrodes S1, the plurality of first drain electrodes D1, the plurality of second source electrodes S2, and the plurality of second drain electrodes D2 are in a same layer and patterned in a single process using a same mask plate and a same conductive material. Optionally, the plurality of first source electrodes S1, the plurality of first drain electrodes D1, the plurality of second source electrodes S2, and the plurality of second drain electrodes D2 are in different layers, e.g., formed in two patterning processes or using two mask plates. For example, the plurality of first source electrodes S1 and the plurality of first drain electrodes D1 are in a first layer, and the plurality of second source electrodes S2 and the plurality of second drain electrodes D2 are in a second layer.

Referring to FIG. 3 and FIG. 4, the array substrate in some embodiments further includes a passivation layer 50 on a side of the source-drain electrode layer 300 distal to the gate insulating layer 20. Optionally, the array substrate further includes a second electrode layer 80 on a side of the passivation layer 50 distal to the source-drain electrode layer 300. The first electrode layer 60 and the second electrode layer 80 are two different layers selected from a pixel electrode layer and a common electrode layer. Optionally, the first electrode layer 60 is a pixel electrode layer and the second electrode layer 80 is a common electrode layer. Optionally, the first electrode layer 60 is a common electrode layer and the second electrode layer 80 is a pixel electrode layer.

The plurality of first bottom-gate type thin film transistors 1 and the plurality of second bottom-gate type thin film transistors 2 depicted in FIGS. 2 to 4 may represent those depicted in FIG. 1B or FIG. 1C.

In another aspect, the present disclosure further provides a method of fabricating an array substrate. In some embodiments, the method includes forming a plurality of first bottom-gate type thin film transistors each of which comprising a metal oxide active layer and a plurality of second bottom-gate type thin film transistors each of which comprising a silicon active layer. Optionally, the silicon active layer is a polycrystalline silicon active layer. Optionally, the silicon active layer is an amorphous silicon active layer.

In some embodiments, the method includes forming a gate electrode layer on a base substrate, the gate electrode layer formed to include a plurality of first gate electrodes respectively for the plurality of first bottom-gate type thin film transistors and a plurality of second gate electrodes respectively for the plurality of second bottom-gate type thin film transistors; forming a gate insulating layer on a side of the gate electrode layer distal to the base substrate; forming a metal oxide layer having a plurality of metal oxide active layers respectively for the plurality of first bottom-gate type thin film transistors, each of the plurality of metal oxide active layers on a side of the gate insulating layer distal to one of the plurality of first gate electrodes; and forming a polysilicon layer having a plurality of polycrystalline silicon active layers respectively for the plurality of second bottom-gate type thin film transistors, each of the plurality of polycrystalline silicon active layers on a side of the gate insulating layer distal to one of the plurality of second gate electrodes.

In some embodiments, the method further includes forming a first insulating layer on a side of the polysilicon layer distal to the gate insulating layer; and forming a second insulating layer on a side of the metal oxide layer distal to the first insulating layer. The first insulating layer is formed between the polysilicon layer and the metal oxide layer. Optionally, the method further includes forming a source-drain electrode layer, the source-drain electrode layer is formed to comprise a plurality of first source electrodes, a plurality of first drain electrodes, a plurality of second source electrodes, and a plurality of second drain electrodes; forming vias extending through the second insulating layer for electrically connecting each of the plurality of metal oxide active layers to one of the plurality of first source electrodes and one of the plurality of first drain electrodes; and forming vias extending through the first insulating layer and the second insulating layer for electrically connecting each of the plurality of polycrystalline silicon active layers to one of the plurality of second source electrodes and one of the plurality of second drain electrodes. Optionally, the method further includes forming a passivation layer on a side of the source-drain electrode layer distal to the second insulating layer; forming a first electrode layer on a side of the passivation layer distal to the source-drain electrode layer; and forming a second electrode layer on a side of the first electrode layer distal to the base substrate. The first electrode layer and the second electrode layer are selected from a pixel electrode layer and a common electrode layer.

In some embodiments, the method further includes forming a first electrode layer and forming a second electrode layer, the first electrode layer and the second electrode layer selected from a pixel electrode layer and a common electrode layer. Optionally, the first electrode layer and the gate electrode layer are formed in a same layer in a single process using a same mask plate. The gate insulating layer is formed on a side of the gate electrode layer and the first electrode layer distal to the base substrate.

In some embodiments, the method thither includes forming a source-drain electrode layer on a side of the metal oxide layer and the polysilicon layer distal to the gate insulating layer. Optionally, the source-drain electrode layer is formed to include a plurality of first source electrodes, a plurality of first drain electrodes, a plurality of second source electrodes, and a plurality of second drain electrodes. Each of the plurality of metal oxide active layers is formed to be electrically connected to one of the plurality of first source electrodes and one of the plurality of first drain electrodes. Each of the plurality of polycrystalline silicon active layers is formed to be electrically connected to one of the plurality of second source electrodes and one of the plurality of second drain electrodes. Optionally, channel regions of the plurality of metal oxide active layers are formed in a back channel etching process.

In some embodiments, the method further includes forming a first insulating layer on a side of the polysilicon layer distal to the gate insulating layer, the first insulating layer formed between the polysilicon layer and the metal oxide layer; and forming vias extending through the first insulating layer for electrically connected each of the plurality of polycrystalline silicon active layers to one of the plurality of second source electrodes and one of the plurality of second drain electrodes.

Optionally, the method further includes forming a passivation layer on a side of the source-drain electrode layer distal to the gate insulating layer. The second electrode layer is on a side of the passivation layer distal to the source-drain electrode layer.

Figure 5A:
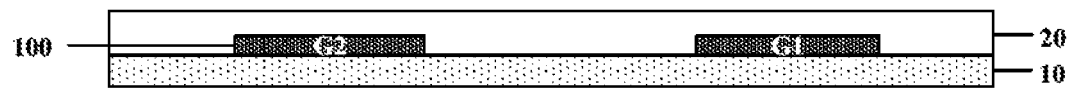
FIGS. 5A to 5E illustrate a process of fabricating an array substrate in some embodiments according to the present disclosure.

FIGS. 5A to 5E illustrate a process of fabricating an array substrate in some embodiments according to the present disclosure. Referring to FIG. 5A, a gate electrode layer 100 is formed on a base substrate 10. The gate electrode layer 100 is formed to include a plurality of first gate electrodes G1 respectively for the plurality of first bottom-gate type thin film transistors and a plurality of second gate electrodes G2 respectively for the plurality of second bottom-gate type thin film transistors. The plurality of first gate electrodes G1 and the plurality of second gate electrodes G2 are formed in a same patterning process using a same mask plate and a same material. Subsequently, a gate insulating layer 20 is formed on a side of the gate electrode layer 100 distal to the base substrate 10.

Figure 5B:
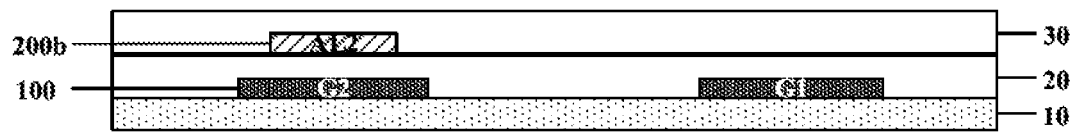

Referring to FIG. 5B, a polysilicon layer 200b having a plurality of polycrystalline silicon active layers AL2 respectively for the plurality of second bottom-gate type thin film transistors is then formed on a side of the gate insulating layer 20 distal to the base substrate 10. Each of the plurality of polycrystalline silicon active layers AL2 is formed on a side of the gate insulating layer 20 distal to one of the plurality of second gate electrodes G2.

Optionally, the polysilicon layer 200b may be formed using an amorphous silicon material. The method includes forming an amorphous silicon material layer on a side, of the gate insulating layer 20 distal to the base substrate 10; and crystallizing the amorphous silicon material layer to form a polycrystalline silicon material layer. Optionally, the method further includes dehydrogenating the amorphous silicon material layer prior to the step of crystallizing the amorphous silicon material layer. Optionally, the step of crystallizing the amorphous silicon material layer is performed by an excimer laser annealing process. After the polycrystalline silicon material layer is formed, it is patterned using a mask plate to form the polysilicon layer 200b having the plurality of polycrystalline silicon active layers AL2.

Subsequent to forming the polysilicon layer 200b, a first insulating layer 30 is formed on a side of the polysilicon layer 200b distal to the gate insulating layer 20.

Figure 5C:
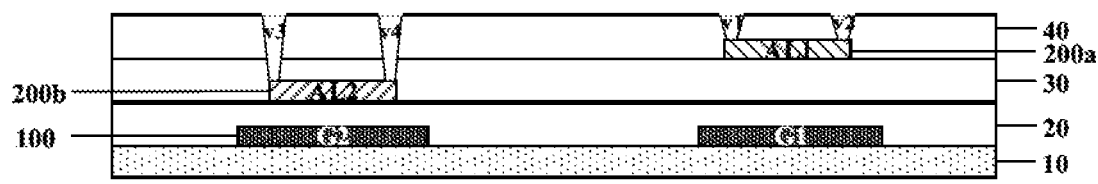

Referring to FIG. 5C, a metal oxide layer 200a having a plurality of metal oxide active layers AL1 respectively for the plurality of first bottom-gate type thin film transistors is then formed on a side of the first insulating layer 30 distal to the gate insulating layer 20. Each of the plurality of metal oxide active layers AL1 is formed on a side of the first insulating layer 30 distal to one of the plurality of first gate electrodes G1.

Optionally, the metal oxide layer 200a may be formed by first depositing a metal oxide material layer on a side of the first insulating layer 30 distal to the gate insulating layer 20; forming a photoresist layer on a side of the metal oxide material layer distal to the first insulating layer 30, exposing and developing the photoresist layer to form a photoresist pattern corresponding to the metal oxide layer 200a, and etching the metal oxide material layer thereby forming the metal oxide layer 200a.

Subsequent to forming the metal oxide layer 200a, a second insulating layer 40 is formed on a side of the metal oxide layer 200a distal to the first insulating layer 30. The second insulating layer 40 is made of an etch stop material for protecting the channel region of the plurality of metal oxide active layers AL1 from etchants during subsequent steps of forming source and drain electrodes.

Figure 5D:
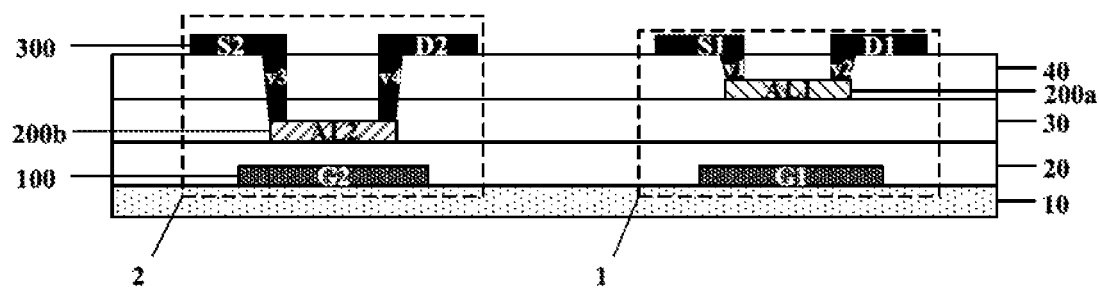

Referring to FIG. 5D, the method further includes forming a plurality of first vias v1 and a plurality of second vias v2 extending through the second insulating layer 40; and forming a plurality of third vias v3 and a plurality of fourth vias v4 extending through the second insulating layer 40 and the first insulating layer 30. The plurality of first vias v1, the plurality of second vias v2, the plurality of third vias v3, and the plurality of fourth vias v4 may be formed using a mask plate, e.g., a gray-tone or half-tone mask plate.

Subsequently, a source-drain electrode layer 300 is formed on a side of the second insulating layer 40 distal to the first insulating layer 30. The source-drain electrode layer 300 is formed to include a plurality of first source electrodes S1, a plurality of first drain electrodes D1, a plurality of second source electrodes S2, and a plurality of second drain electrodes D2. Each of the plurality of metal oxide active layers AL1 is electrically connected to one of the plurality of first source electrodes S1 through one of the plurality of first vias v1 and to one of the plurality of first drain electrodes D1 through one of the plurality of second vias v2. Each of the plurality of polycrystalline silicon active layers AL2 is electrically connected to one of the plurality of second source electrodes S2 through one of the plurality of third vias v3 and to one of the plurality of second drain electrodes D2 through one of the plurality of fourth vias v4. Optionally, the source-drain electrode layer 300 is formed using a mask plate.

Figure 5E:
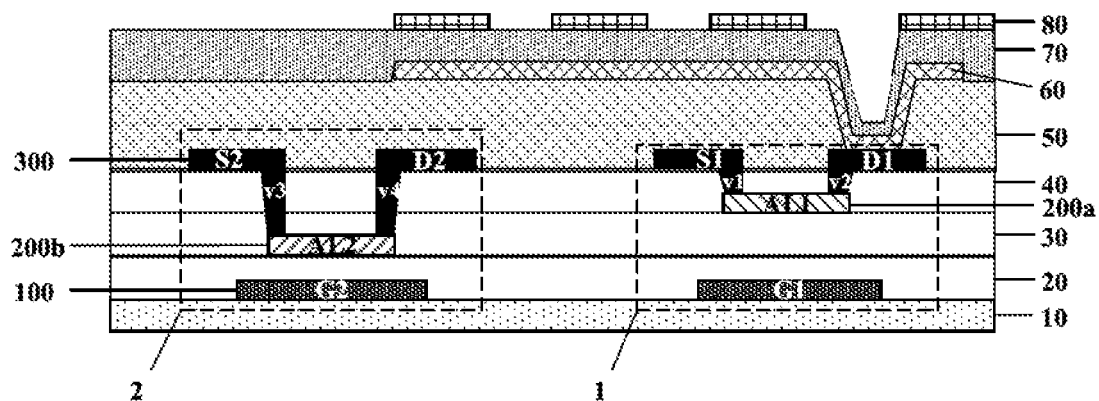

Referring to FIG. 5E, subsequent to forming the source-drain electrode layer 300, a passivation layer 50 is formed using a mask plate on a side of the source-drain electrode layer 300 distal to the second insulating layer 40. A first electrode layer 60 is formed on a side of the passivation layer 50 distal to the second insulating layer 40. A third insulating layer 70 is formed on a side of the first electrode layer 60 distal to the passivation layer 50. A second electrode layer 80 is formed on a side of the third insulating layer 70 distal to the first electrode layer 60. Optionally, the first electrode layer 60 is a pixel electrode layer, and the second electrode layer 80 is a common electrode layer. Optionally, the first electrode layer 60 is a common electrode layer, and the second electrode layer 80 is a pixel electrode layer. A total of only 9 mask plates is required to make an array substrate of FIG. 5E.

Figure 6A:
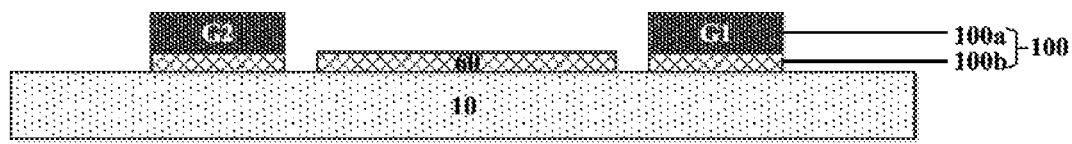
FIGS. 6A to 6E illustrate a process of fabricating an array substrate in some embodiments according to the present disclosure.

FIGS. 6A to 6E illustrate a process of fabricating an array substrate in some embodiments according to the present disclosure. Referring to FIG. 6A, a first electrode layer 60 and a gate electrode layer 100 are first formed in a same layer on a base substrate 10, e.g., using a single mask plate and patterned in a single process. In one example, the first electrode layer 60 and the gate electrode layer 100 are patterned using a gray-tone mask plate or a half-tone mask plate. As shown in FIG. 6A, the gate electrode layer 100 is formed to include two sub-layers, a first sublayer 100a and a second sublayer 100b. The first sublayer 100a is formed on a side of a second sublayer 100b distal to the base substrate 10. The second sublayer 100b is made of a same material as the first electrode layer 60. In one example, a transparent conductive material layer is first deposited on the base substrate 10, followed by depositing a metal conductive material layer on a side of the transparent conductive material layer distal to the base substrate 10. A photoresist layer is then deposited on the metal conductive material layer, and a photoresist pattern is formed using a gray-tone or half-tone mask plate. The photoresist layer is exposed and developed using the gray-tone or half-tone mask plate, the transparent conductive material layer and the metal conductive material layer are etched to form the first electrode layer 60, the first sublayer 100a of the gate electrode layer 100, and the second sublayer 100b of the gate electrode layer 100.

Figure 6B:
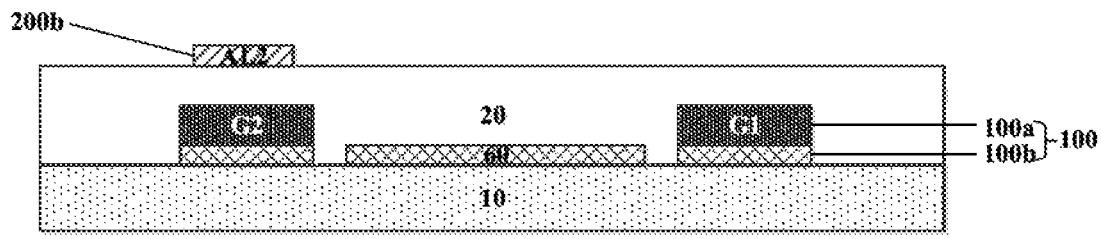

Referring to FIG. 6B, a gate insulating layer 20 is formed on a side of the gate electrode layer 100 distal to the base substrate 10. Subsequently, a polysilicon layer 200b having a plurality of polycrystalline silicon active layers AL2 respectively for the plurality of second bottom-gate type thin film transistors is then formed on a side of the gate insulating layer 20 distal to the base substrate 10. Each of the plurality of polycrystalline silicon active layers AL2 is formed on a side of the gate insulating layer 20 distal to one of the plurality of second gate electrodes G2. Optionally, the polysilicon layer 200b may be formed using an amorphous silicon material as discussed in the context of FIG. 5B.

Figure 6C:
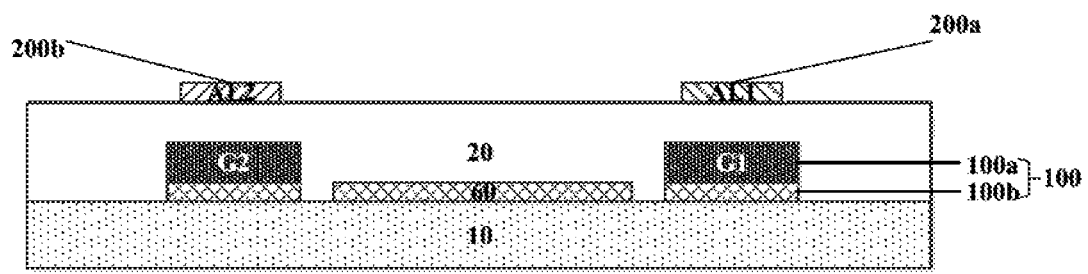

Referring to FIG. 6C, subsequent to forming the polysilicon layer 200b, a metal oxide layer 200a having a plurality of metal oxide active layers AL1 respectively for the plurality of first bottom-gate type thin film transistors is then formed on a side of the gate insulating layer 20 distal to the base substrate 10. Each of the plurality of metal oxide active layers AL1 is formed on a side of the gate insulating layer 20 distal to one of the plurality of first gate electrodes G1.

Optionally, the metal oxide layer 200a may be formed by first depositing a metal oxide material layer on a side of the first insulating layer 30 distal to the gate insulating layer 20; forming a photoresist layer on a side of the metal oxide material layer distal to the first insulating layer 30, exposing and developing the photoresist layer to form a photoresist pattern corresponding to the metal oxide layer 200a, and etching (e.g., wet etching the metal oxide material layer thereby forming the metal oxide layer 200a.

Figure 6D:
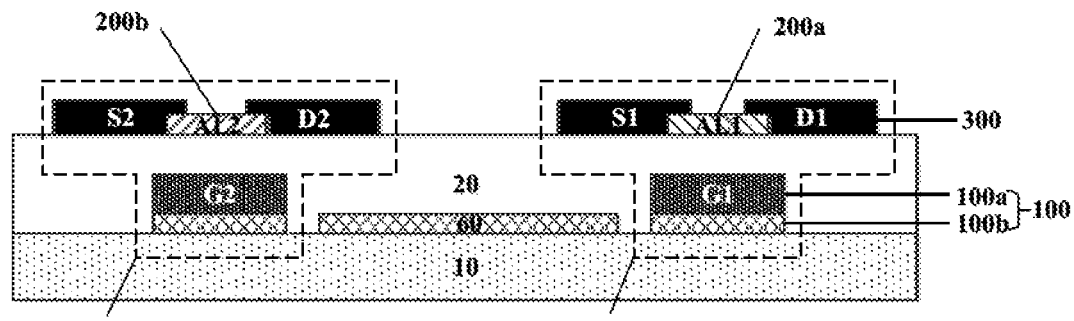

Referring to FIG. 6D, subsequent to forming the polysilicon layer 200b and the metal oxide layer 200a, a source-drain electrode layer 300 is formed on a side of the polysilicon layer 200b and the metal oxide layer 200a distal to the gate insulating layer 20. The source-drain electrode layer 300 is formed to include a plurality of first source electrodes S1, a plurality of first drain electrodes D1, a plurality of second source electrodes S2, and a plurality of second drain electrodes D2. Each of the plurality of metal oxide active layers AL1 is electrically connected to one of the plurality of first source electrodes S1 and one of the plurality of first drain electrodes D1. Each of the plurality of polycrystalline silicon active layers AL2 is electrically connected to one of the plurality of second source electrodes S2 and one of the plurality of second drain electrodes D2.

Optionally, the source-drain electrode layer 300 is formed by first forming an electrode material layer on side of the polysilicon layer 200b and the metal oxide layer 200a distal to the gate insulating layer 20, followed by etching the electrode material layer thereby forming the source-drain electrode layer 300. Optionally, the electrode material layer is etched by a dry etching process. Examples of dry etching methods include, hut are not limited to, reactive ion etching (RIE), deep reactive ion etching (DRIE), inductively coupled plasma etching (ICP), electron cyclotron resonance etching (ECR), and ion beam etching, and laser machining. Optionally, the electrode material layer includes molybdenum, and the dry etching is performed using a gas containing chloride and oxygen. Accordingly, the channel regions of the plurality of metal oxide active layers AL1 are formed in a back channel etching process.

Optionally, the electrode material layer is etched by a wet etching process. In one example, the wet etching process uses an etching solution having an etching selectivity for the electrode material layer. For example, the etching solution may be selected so that the metal oxide layer 200a is substantially resistant to the etching solution whereas the etching solution selectively etches the electrode material layer. Accordingly, the channel regions of the plurality of metal oxide active layers can be formed in a back channel etching process.

Figure 6E:
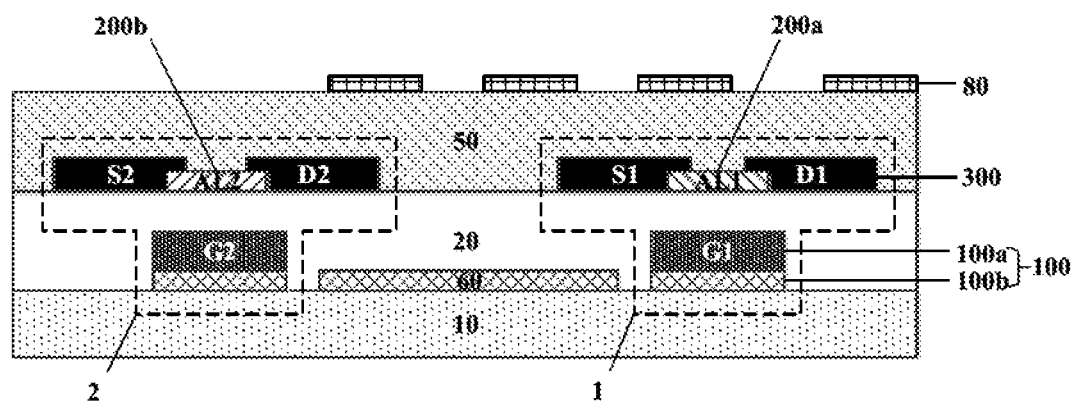

Referring to FIG. 6E, subsequent to forming the source-drain electrode layer 300, a passivation layer 50 is formed on a side of the source-drain electrode layer 300 distal to the gate insulating layer 20, and a second electrode layer 80 is formed on a side of the passivation layer 50 distal to the source-drain electrode layer 300.

Figure 7A:
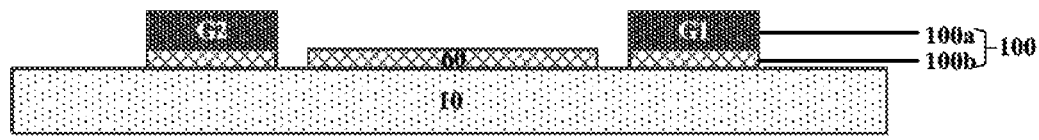
FIGS. 7A to 7E illustrate a process of fabricating an array substrate in some embodiments according to the present disclosure.
Figure 7B:
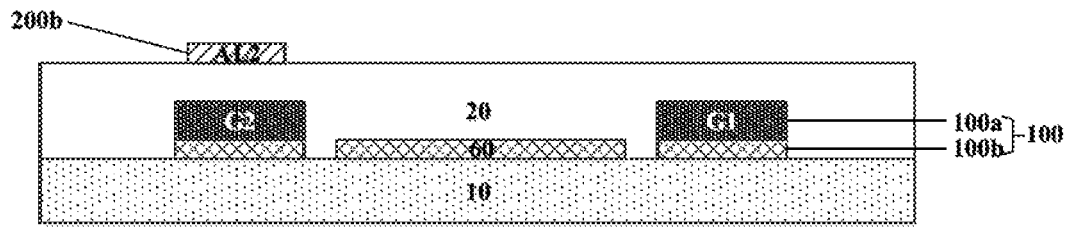
Figure 7C:
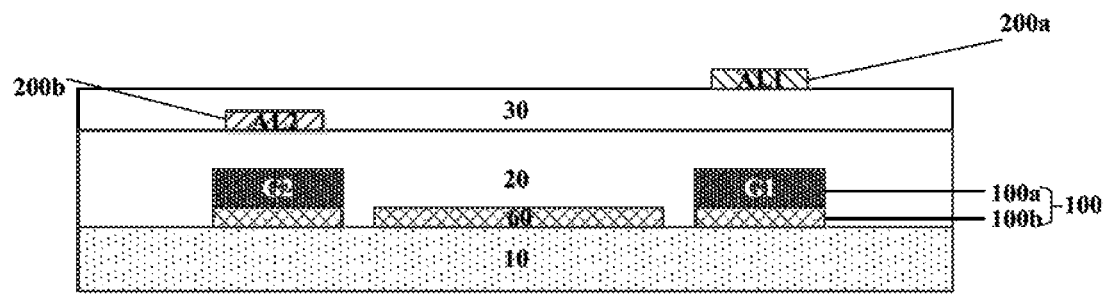

FIGS. 7A to 7E illustrate a process of fabricating an array substrate in some embodiments according to the present disclosure. The processes depicted in FIG. 7A and FIG. 7B are substantially similar to those depicted in FIG. 6A and FIG. 6B. Referring to FIG. 7C, subsequent to forming the polysilicon layer 200b, a first insulating layer 30 is formed an a side of the polysilicon layer 200b distal to the gate insulating layer 20. A metal oxide layer 200a having a plurality of metal oxide active layers AL1 respectively fir the plurality of first bottom-gate type thin film transistors is then formed on a side of the first insulating layer 30 distal to the gate insulating layer 20. Each of the plurality of metal oxide active layers AL1 is formed on a side of the first insulating layer 30 distal to one of the plurality of first gate electrodes G1.

Optionally, the metal oxide layer 200a may be formed by first depositing a metal oxide material layer on a side of the first insulating layer 30 distal to the gate insulating layer 20; forming a photoresist layer on a side of the metal oxide material layer distal to the first insulating layer 30, exposing and developing the photoresist layer to form a photoresist pattern corresponding to the metal oxide layer 200a, and etching the metal oxide material layer thereby forming the metal oxide layer 200a.

Figure 7D:
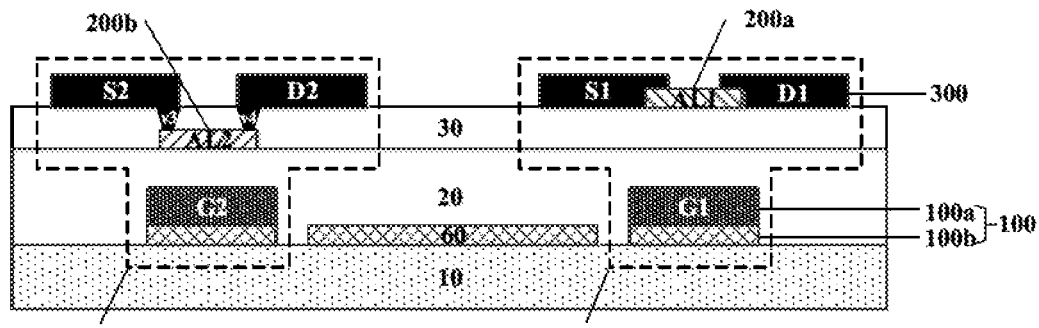

Subsequent to forming the polysilicon layer 200b, referring to FIG. 7D, the method further includes forming a plurality of third vias v3 and a plurality of fourth vias v4 extending through the first insulating layer 30. A source-drain electrode layer 300 is then formed on a side of the polysilicon layer 200b and the metal oxide layer 200a distal to the gate insulating layer 20. The source-drain electrode layer 300 is formed to include a plurality of first source electrodes S1, a plurality of first drain electrodes D1, a plurality of second source electrodes S2, and a plurality of second drain electrodes D2. Each of the plurality of metal oxide active layers AL1 is electrically connected to one of the plurality of first source electrodes S1 and one of the plurality of first drain electrodes D1. Each of the plurality of polycrystalline silicon active layers AL2 is electrically connected to one of the plurality of second source electrodes S2 through one of the plurality of third vias v3 and to one of the plurality of second drain electrodes D2 through one of the plurality of fourth vias v4.

Optionally, the source-drain electrode layer 300 is formed by first forming an electrode material layer on side of the polysilicon layer 200b and the metal oxide layer 200a distal to the gate insulating layer 20, followed by etching the electrode material layer thereby forming the source-drain electrode layer 300. Optionally, the electrode material layer is etched by a dry etching process. Accordingly, the channel regions of the plurality of metal oxide active layers AL1 are formed in a back channel etching process. As compared to the processes depicted in FIGS. 6A to 6E, the polysilicon layer 200b in FIG. 7D is covered by the first insulating layer, and are not affected by the dry etching process of the source and drain electrodes.

Figure 7E:
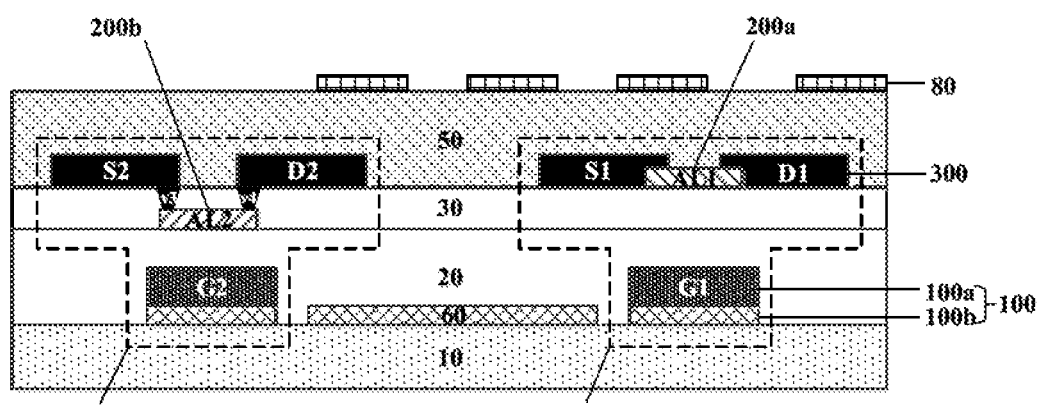

Referring to FIG. 7E, subsequent to forming the source-drain electrode layer 300, a passivation layer 50 is formed on a side of the source-drain electrode layer 300 distal to the gate insulating layer 20, and a second electrode layer 80 is formed on a side of the passivation layer 50 distal to the source-drain electrode layer 300.

In another aspect, the present disclosure provides a display panel having an array substrate described herein or fabricated by a method described herein. Optionally, the display panel further includes a counter substrate (e.g., a color filter substrate) facing the array substrate. Optionally, the pixel electrode layer and the common electrode layer are both disposed in the array substrate. Optionally, the pixel electrode layer is disposed in the array substrate, and the common electrode layer is disposed in the counter substrate. Optionally, the pixel electrode layer is disposed in the counter substrate, and the common electrode layer is disposed in the array substrate. Optionally, the display panel is a liquid crystal display panel. Optionally, the display panel is an organic light emitting diode display panel.

In another aspect, the present disclosure provides a display apparatus having the array substrate described herein or fabricated by a method described herein. Optionally, the display apparatus further includes a counter substrate (e.g., a color filter substrate) facing the array substrate. Optionally, the pixel electrode layer and the common electrode layer are both disposed in the array substrate. Optionally, the pixel electrode layer is disposed in the array substrate, and the common electrode layer is disposed in the counter substrate.

Optionally, the pixel electrode layer is disposed in the counter substrate, and the common electrode layer is disposed in the array substrate. Optionally, the display apparatus is a liquid crystal display apparatus. Optionally, the display apparatus is an organic light emitting diode display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, having a plurality of first bottom-gate type thin film transistors each of which comprising a metal oxide active layer and a plurality of second bottom-gate type thin film transistors each of which comprising a silicon active layer;

the array substrate comprises:
a base substrate;
a gate electrode layer on the base substrate and comprising a plurality of first gate electrodes respectively for the plurality of first bottom-gate type thin film transistors and a plurality of second gate electrodes respectively for the plurality of second bottom-gate type thin film transistors;
a gate insulating layer on a side of the gate electrode layer distal to the base substrate;
a metal oxide layer comprising a plurality of metal oxide active layers respectively for the plurality of first bottom-gate type thin film transistors, each of the plurality of metal oxide active layers on a side of the gate insulating layer distal to one of the plurality of first gate electrodes;
a polysilicon layer comprising a plurality of polycrystalline silicon active layers respectively for the plurality of second bottom-gate type thin film transistors, each of the plurality of polycrystalline silicon active layers on a side of the gate insulating layer distal to one of the plurality of second gate electrodes;
a first electrode layer; and
a second electrode layer;
wherein the first electrode layer and the second electrode layer are two different layers selected from a pixel electrode layer and a common electrode layer;
the first electrode layer is in a same layer as the gate electrode layer; and
the gate insulating layer is on a side of the gate electrode layer and the first electrode layer distal to the base substrate.

2. The array substrate of claim 1, further comprising:
a first insulating layer on a side of the polysilicon layer distal to the gate insulating layer; and
a second insulating layer on a side of the metal oxide layer distal to the first insulating layer;
wherein the first insulating layer is between the polysilicon layer and the metal oxide layer.

3. The array substrate of claim 2, further comprising a source-drain electrode layer comprising a plurality of first source electrodes, a plurality of first drain electrodes, a plurality of second source electrodes, and a plurality of second drain electrodes;
each of the plurality of metal oxide active layers is electrically connected to one of the plurality of first source electrodes and one of the plurality of first drain electrodes through vias extending through the second insulating layer; and
each of the plurality of polycrystalline silicon active layers is electrically connected to one of the plurality of second source electrodes and one of the plurality of second drain electrodes through vias extending through the first insulating layer and the second insulating layer.

4. The array substrate of claim 3, further comprising a passivation layer on a side of the source-drain electrode layer distal to the second insulating layer;
a first electrode layer on a side of the passivation layer distal to the source-drain electrode layer; and
a second electrode layer on a side of the first electrode layer distal to the base substrate;
wherein the first electrode layer and the second electrode layer are two different layers selected from a pixel electrode layer and a common electrode layer.

5. The array substrate of claim 1, further comprising a source-drain electrode layer on a side of the metal oxide layer and the polysilicon layer distal to the gate insulating layer;
the source-drain electrode layer comprising a plurality of first source electrodes, a plurality of first drain electrodes, a plurality of second source electrodes, and a plurality of second drain electrodes;
each of the plurality of metal oxide active layers is electrically connected to one of the plurality of first source electrodes and one of the plurality of first drain electrodes; and
each of the plurality of polycrystalline silicon active layers is electrically connected to one of the plurality of second source electrodes and one of the plurality of second drain electrodes.

6. The array substrate of claim 5, wherein the plurality of first bottom-gate type thin film transistors are back channel etching type thin film transistors.

7. The array substrate of claim 5, further comprising a first insulating layer on a side of the polysilicon layer distal to the gate insulating layer;
wherein the first insulating layer is between the polysilicon layer and the metal oxide layer; and
each of the plurality of polycrystalline silicon active layers is electrically connected to one of the plurality of second source electrodes and one of the plurality of second drain electrodes through vias extending through the first insulating layer.

8. The array substrate of claim 5, further comprising:
a passivation layer on a side of the source-drain electrode layer distal to the gate insulating layer;
wherein the second electrode layer is on a side of the passivation layer distal to the source-drain electrode layer.

9. The array substrate of claim 1, wherein the plurality of first bottom-gate type thin film transistors are in a display area, and the plurality of second bottom-gate type thin film transistors are in a peripheral area.

10. The array substrate of claim 1, wherein the plurality of first bottom-gate type thin film transistors are a plurality of drive thin film transistors each of which is connected to a power supply line and an organic light emitting diode; and the plurality of second bottom-gate type thin film transistors are a plurality of switch thin film transistors each of which is connected to a data line and a gate electrode of one of the plurality of drive thin film transistors.

11. The array substrate of claim 1, further comprising a display driver circuitry;
wherein the display driver circuitry comprises the plurality of second bottom-gate type thin film transistors.

12. A display apparatus, comprising the array substrate of claim 1.

13. A method of fabricating an array substrate, comprising:
forming a plurality of first bottom-gate type thin film transistors each of which comprising a metal oxide active layer and a plurality of second bottom-gate type thin film transistors each of which comprising a silicon active layer;
forming a gate electrode layer on a base substrate, the gate electrode layer formed to comprise a plurality of first gate electrodes respectively for the plurality of first bottom-gate type thin film transistors and a plurality of second gate electrodes respectively for the plurality of second bottom-gate type thin film transistors;
forming a gate insulating layer on a side of the gate electrode layer distal to the base substrate;
forming a metal oxide layer comprising a plurality of metal oxide active layers respectively for the plurality of first bottom-gate type thin film transistors, each of the plurality of metal oxide active layers on a side of the gate insulating layer distal to one of the plurality of first gate electrodes and; and
forming a polysilicon layer comprising a plurality of polycrystalline silicon active layers respectively for the plurality of second bottom-gate type thin film transistors, each of the plurality of polycrystalline silicon active layers on a side of the gate insulating layer distal to one of the plurality of second gate electrodes;
forming a first electrode layer; and
forming a second electrode layer;
wherein the first electrode layer and the second electrode layer are two different layers selected from a pixel electrode layer and a common electrode layer;
the first electrode layer and the gate electrode layer are formed in a same layer in a single process using a same mask plate; and
the gate insulating layer is formed on a side of the gate electrode layer and the first electrode layer distal to the base substrate.

14. The method of claim 13, further comprising forming a first insulating layer on a side of the polysilicon layer distal to the gate insulating layer; and
forming a second insulating layer on a side of the metal oxide layer distal to the first insulating layer;
wherein the first insulating layer is formed between the polysilicon layer and the metal oxide layer.

15. The method of claim 14, further comprising forming a source-drain electrode layer, the source-drain electrode layer is formed to comprise a plurality of first source electrodes, a plurality of first drain electrodes, a plurality of second source electrodes, and a plurality of second drain electrodes;
forming vias extending through the second insulating layer for electrically connecting each of the plurality of metal oxide active layers to one of the plurality of first source electrodes and one of the plurality of first drain electrodes; and
forming vias extending through the first insulating layer and the second insulating layer for electrically connecting each of the plurality of polycrystalline silicon active layers to one of the plurality of second source electrodes and one of the plurality of second drain electrodes.

16. The method of claim 13, further comprising forming a source-drain electrode layer on a side of the metal oxide layer and the polysilicon layer distal to the gate insulating layer;
wherein the source-drain electrode layer is formed to comprise a plurality of first source electrodes, a plurality of first drain electrodes, a plurality of second source electrodes, and a plurality of second drain electrodes;
each of the plurality of metal oxide active layers is formed to be electrically connected to one of the plurality of first source electrodes and one of the plurality of first drain electrodes;
each of the plurality of polycrystalline silicon active layers is formed to be electrically connected to one of the plurality of second source electrodes and one of the plurality of second drain electrodes; and
channel regions of the plurality of metal oxide active layers are formed in a back channel etching process.

* * * * *